US007916260B2

United States Patent
Lee et al.

(10) Patent No.: US 7,916,260 B2
(45) Date of Patent: Mar. 29, 2011

(54) DISPLAY SUBSTRATE, METHOD FOR MANUFACTURING THE SAME AND DISPLAY APPARATUS HAVING THE SAME

(75) Inventors: Bong-Jun Lee, Seoul (KR);
Myung-Koo Hur, Cheonan-si (KR);
Jong-Oh Kim, Cheonan-si (KR);
Dong-Wuuk Seo, Cheonan-si (KR);
Sung-Man Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 109 days.

(21) Appl. No.: 12/033,986

(22) Filed: Feb. 20, 2008

(65) Prior Publication Data

US 2008/0316384 A1    Dec. 25, 2008

(30) Foreign Application Priority Data

Jun. 20, 2007    (KR) .................. 10-2007-0060254

(51) Int. Cl.
*G02F 1/1343* (2006.01)
(52) U.S. Cl. ........................................ 349/143
(58) Field of Classification Search .................. 349/143
See application file for complete search history.

(56) References Cited

U.S. PATENT DOCUMENTS 6,674,495 B1 *   1/2004   Hong et al. ..................... 349/43
2007/0285607 A1 * 12/2007   Kim et al. ..................... 349/141

FOREIGN PATENT DOCUMENTS

| JP | 2001-313397 | 11/2001 |
| KR | 1020020018883 A | 3/2002 |
| KR | 1020050026667 A | 3/2005 |

* cited by examiner

*Primary Examiner* — Jerry T Rahll
(74) *Attorney, Agent, or Firm* — Cantor Colburn LLP

(57) ABSTRACT

A display substrate includes a first metal pattern formed on a substrate and includes a data line to which a pixel voltage is applied, an insulating layer formed on the substrate on which the first metal pattern is formed, an active pattern formed on the insulating layer, a second metal pattern formed on the insulating layer and including a gate line and a storage line, the gate line crossing the data line, a scanning signal applied to the gate line, a protective layer formed on the substrate on which the second metal pattern is formed, and a pixel electrode formed on the protective layer. A method for manufacturing the display substrate, and a display apparatus including the display substrate are further provided.

21 Claims, 9 Drawing Sheets

US 7,916,260 B2

DISPLAY SUBSTRATE, METHOD FOR MANUFACTURING THE SAME AND DISPLAY APPARATUS HAVING THE SAME

This application claims priority to Korean Patent Application No. 2007-60254, filed on Jun. 20, 2007, and all the benefits accruing therefrom under 35 U.S.C. §119, the contents of which in its entirety are herein incorporated by reference.

BACKGROUND OF THE INVENTION

1. Field of the Invention

The present invention relates to a display substrate, a method for manufacturing the display substrate and a display apparatus having the display substrate. More particularly, the present invention relates to a display substrate capable of enhancing an aperture ratio, a method for manufacturing the display substrate and a display apparatus having the display substrate.

2. Description of the Related Art

A liquid crystal display ("LCD") apparatus, which is a display apparatus that displays an image, includes a display substrate, an opposite substrate facing the display substrate, and a liquid crystal layer disposed between the display substrate and the opposite substrate.

Generally, the display substrate includes a gate line, a data line, a storage line, a thin-film transistor ("TFT"), a pixel electrode and so on that are formed on a transparent substrate, to independently drive a plurality of pixels. The opposite substrate includes a color filter layer having a red color filter R, a green color filter G and a blue color filter B, a black matrix disposed at border portions between the color filters, a common electrode opposite to the pixel electrode, and so on.

Recently, a structure in which a storage line formed from the same layer as the gate line partially overlaps with the data line to prevent light leakage and to enhance an aperture ratio has been developed.

In addition, a structure in which an organic layer or a color filter layer is formed on the display substrate to enhance the aperture ratio has been developed.

BRIEF SUMMARY OF THE INVENTION

The present invention provides a display substrate capable of enhancing an aperture ratio and preventing defects such as vertical lines.

The present invention also provides a method for manufacturing the display substrate.

The prevent invention also provides a display apparatus having the display substrate.

In exemplary embodiments of the present invention, a display substrate includes a first metal pattern, an insulating layer, an active pattern, a second metal pattern, a protective layer and a pixel electrode. The first metal pattern is formed on a substrate and includes a data line to which a pixel voltage is applied. The insulating layer is formed on the substrate on which the first metal pattern is formed. The active pattern is formed on the insulating layer. The second metal pattern is formed on the insulating layer and includes a gate line and a storage line. The gate line crosses the data line. A scanning signal is applied to the gate line. The protective layer is formed on the substrate on which the second metal pattern is formed. The pixel electrode is formed on the protective layer.

The first metal pattern may further include a gate electrode separated from the data line. The second metal pattern may further include a source electrode at least partially overlapping with the gate electrode, and a drain electrode at least partially overlapping with the gate electrode and electrically connected to the pixel electrode.

The active pattern may be at least partially formed between the insulating layer and the source and drain electrodes.

The display substrate may further include a first connecting electrode electrically connecting the data line to the source electrode, and a second connecting electrode electrically connecting the gate line to the gate electrode. The first and second connecting electrodes may include a transparent conductive layer.

The storage line may include a first portion extending substantially parallel to the gate line, and a second portion extending from the first portion to overlap with the data line. A width of the second portion may be larger than a width of the data line disposed under the second portion. The first and second portions may partially overlap with the pixel electrode. An overlapping distance between the second portion and the pixel electrode may be between about 2 µm and about 5 µm.

In other exemplary embodiments according to the present invention, a method for manufacturing a display substrate includes forming a first metal pattern on a substrate, the first metal pattern including a data line to which a pixel voltage is applied, forming an insulating layer on the substrate on which the first metal pattern is formed, forming an active pattern on the insulating layer, forming a second metal pattern including a gate line and a storage line on the insulating layer, where the gate line crosses the data line, and a scanning signal is applied to the gate line, forming a protective layer on the substrate on which the second metal pattern is formed, and forming a pixel electrode on the protective layer.

In still other exemplary embodiments of the present invention, a display apparatus includes a display substrate, an opposite substrate and a liquid crystal layer. The display substrate includes a first metal pattern, an insulating layer, an active pattern, a second metal pattern, a protective layer and a pixel electrode. The first metal pattern is formed on a first substrate and includes a data line to which a pixel voltage is applied. The insulating layer is formed on the first substrate on which the first metal pattern is formed. The active pattern is formed on the insulating layer. The second metal pattern is formed on the insulating layer and includes a gate line and a storage line. The gate line crosses the data line. The scanning signal is applied to the gate line. The protective layer is formed on the substrate on which the second metal pattern is formed. The pixel electrode is formed on the protective layer. The opposite substrate faces the display substrate. The liquid crystal layer is disposed between the display substrate and the opposite substrate.

The storage line may include a first portion extending substantially parallel with the gate line, and a second portion extending from the first portion to overlap with the data line. A width of the second portion may be larger than a width of the data line disposed under the second portion. The first and second portions may partially overlap with the pixel electrode.

The opposite substrate may include a black matrix formed at a side of each pixel, and a common electrode formed on a surface of the opposite substrate facing the display substrate. A width of the black matrix disposed over the data line may be smaller than a width of the second portion of the storage line.

According to the present invention, an aperture ratio may be enhanced and defects such as vertical lines may be prevented.

BRIEF DESCRIPTION OF THE DRAWINGS

The above and other features and advantages of the present invention will become more apparent by describing in detailed exemplary embodiments thereof with reference to the accompanying drawings, in which.

DETAILED DESCRIPTION OF THE INVENTION

Figure 1:
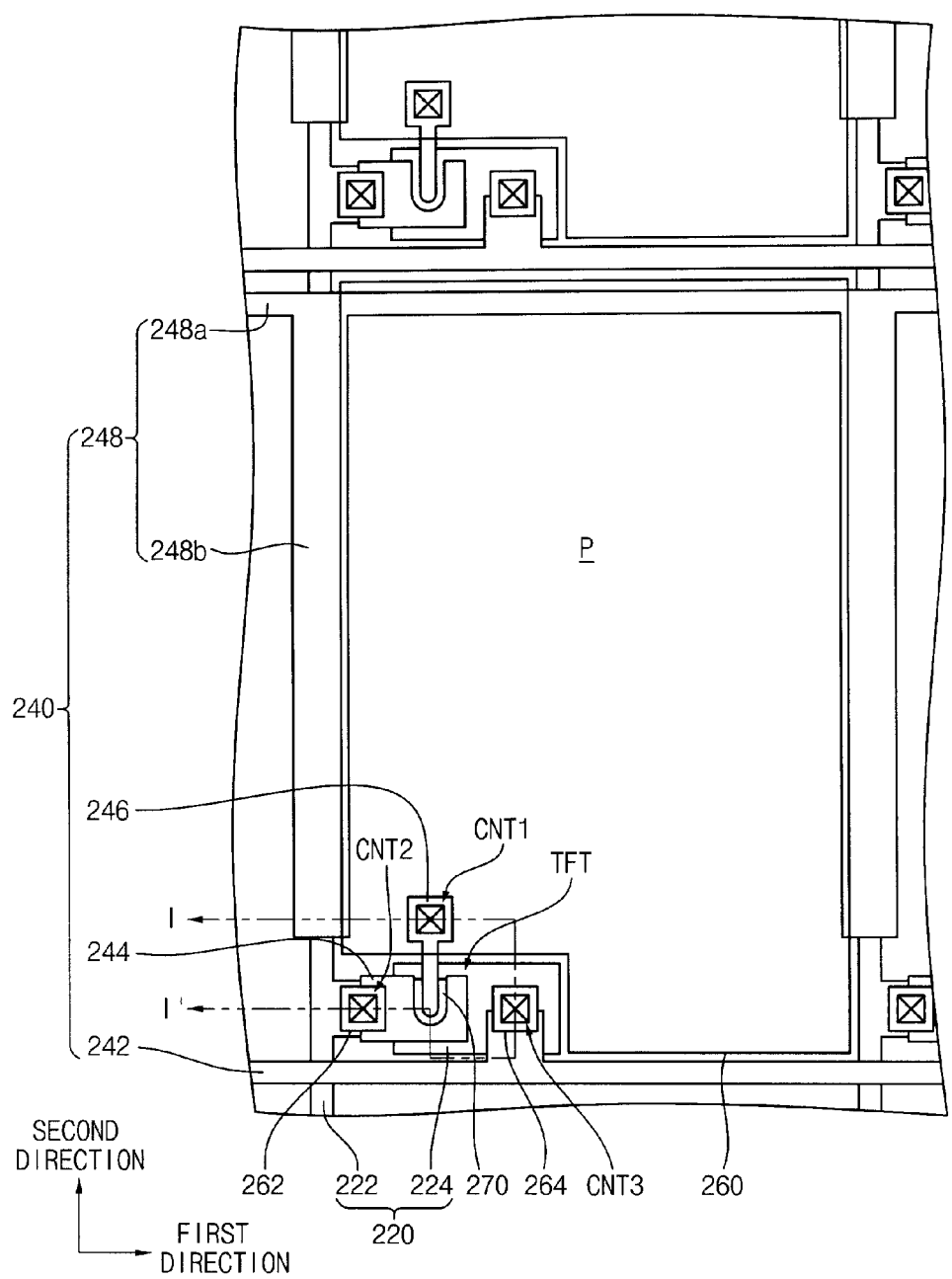
FIG. 1 is a plan view illustrating a portion of an exemplary display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It is recognized herein that a conventional display substrate having the structure in which a storage line formed from the same layer as the gate line partially overlaps with the data line has problems in that the aperture ratio is not sufficiently increased and defects such as vertical lines are caused by parasitic capacitance between the data line and the pixel electrode. It is also recognized herein that a conventional display substrate having the structure in which an organic layer or a color filter layer is formed on the display substrate has problems in that manufacturing costs for the display substrate are increased and defects such as afterimages are caused by changes in a manufacturing process.

Thus, the present invention provides a display substrate capable of enhancing an aperture ratio and preventing defects such as vertical lines, a method for manufacturing the display substrate, and a display apparatus having the display substrate.

Hereinafter, the present invention will be described in detail with reference to the accompanying drawings.

Figure 2:
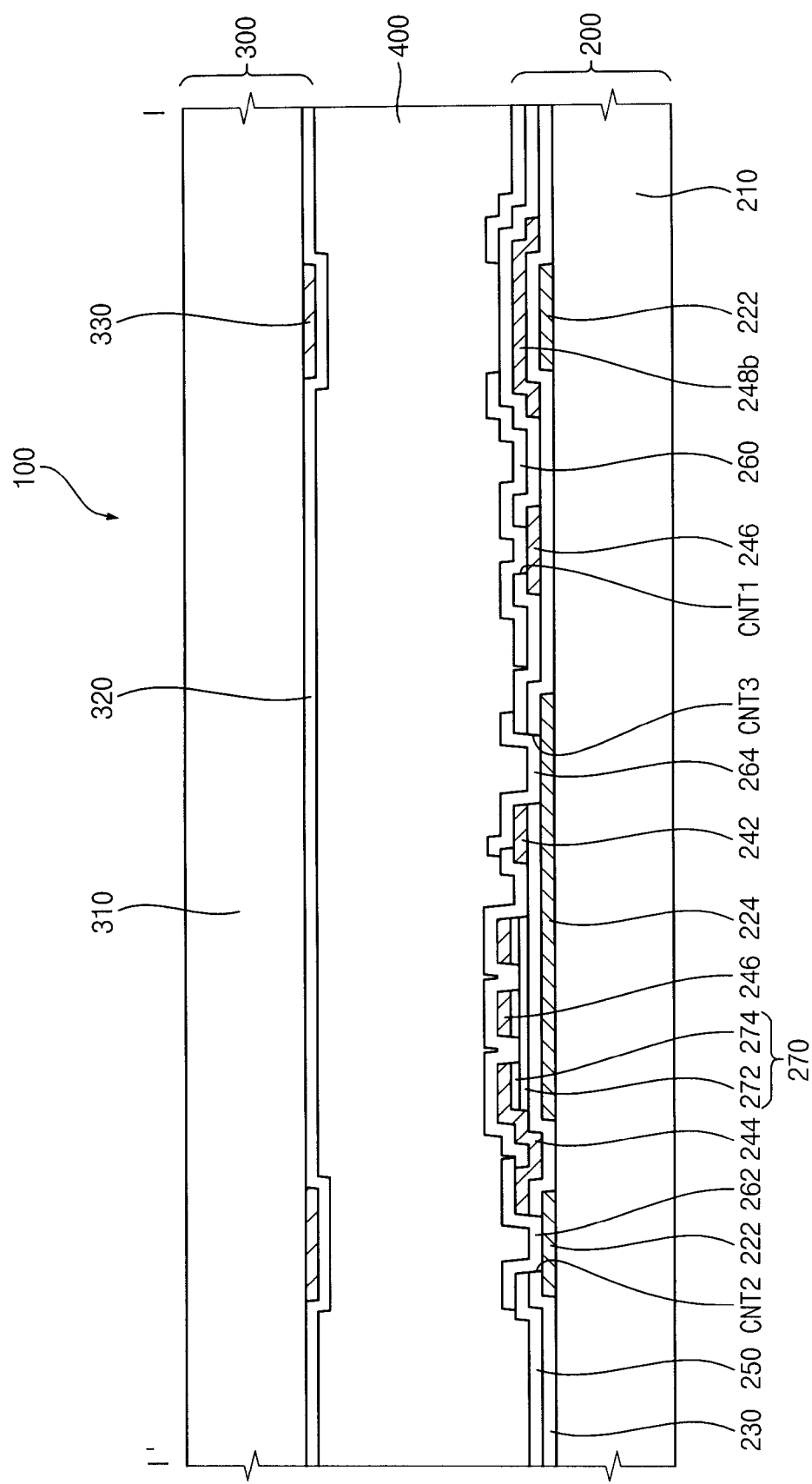
FIG. 2 is a cross-sectional view taken along line I-I' of FIG. 1.

FIG. 1 is a plan view illustrating a portion of an exemplary display apparatus 100 according to an exemplary embodiment of the present invention. FIG. 2 is a cross-sectional view taken along line I-I' of FIG. 1.

Referring to FIGS. 1 and 2, the display apparatus 100 according to an exemplary embodiment includes a display substrate 200, an opposite substrate 300 facing the display substrate 200, and a liquid crystal layer 400 disposed between the display substrate 200 and the opposite substrate 300.

The display substrate 200 includes a first metal pattern 220, an insulating layer 230, a second metal pattern 240, a protective layer 250 and a pixel electrode 260, which are sequentially integrated on a first substrate 210. For example, the first substrate 210 may include a transparent glass or a plastic material.

The first metal pattern 220 is formed on the first substrate 210. The first metal pattern 220 includes a data line 222 to which a pixel voltage is applied and a gate electrode 224 electrically separated from the data line.

For example, the data line 222 may extend along a second direction, and adjacent data lines 222 are adjacent to left and right sides of each pixel P, although in the exemplary embodiment each pixel P is connected to only one of the data lines 222.

The gate electrode 224 is formed inside of each pixel P, may have an island shape, and is separated from the data line 222. The gate electrode 224 forms a gate terminal of a thin-film transistor TFT.

For example, the first metal pattern 220 may have a molybdenum/aluminum (Mo/Al) double-layer structure with aluminum (Al) and molybdenum (Mo) sequentially integrated. Alternatively, the first metal pattern 220 may include a single metal such as aluminum (Al), molybdenum (Mo), neodymium (Nd), chromium (Cr), tantalum (Ta), titanium (Ti), tungsten (W), copper (Cu), silver (Ag) and so on, or an alloy thereof. In addition, the first metal pattern 220 may include a plurality of layers having the single metal or alloy.

The insulating layer 230 is formed on the first substrate 210 on which the first metal pattern 220 is formed. The insulating layer 230 protects and insulates the first metal pattern 220, and for example, may include silicon nitride (SiNx) or silicon oxide (SiOx).

The second metal pattern 240 is formed on the insulating layer 230. The second metal pattern 240 includes a gate line 242, to which a scanning signal is applied, a source electrode 244, a drain electrode 246 and a storage line 248.

The gate line 242 is insulated from the data line 222 by the insulating layer 230, and extends to cross the data line 222. For example, the gate line 242 may extend along a first direction substantially perpendicular to the second direction, and adjacent gate lines 242 are adjacent to upper and lower sides of each pixel P, although in the exemplary embodiment each pixel P is connected to only one of the gate lines 242.

The source electrode 244 is electrically separated from the gate line 242, and at least partially overlaps with the gate electrode 224. The source electrode 244 forms a source terminal of the thin-film transistor TFT. The source electrode 244 may include a shape having a substantially U-shaped indentation.

The drain electrode 246 is spaced apart from the source electrode 244 by a predetermined distance, and at least partially overlaps with the gate electrode 224. The drain electrode 246 forms a drain terminal of the thin-film transistor TFT. The drain electrode 246 may include a finger-shaped portion that is nested within the indentation of the source electrode 244, while maintaining separation from the source electrode 244.

The display substrate 200 may further include an active pattern 270 formed between the insulating layer 230 and the source and drain electrodes 244 and 246, to form the thin-film transistor TFT. The active pattern 270 may be formed on the insulating layer 230 prior to forming the second metal pattern 240. The active pattern 270 may include a semiconductor layer 272 and an ohmic contact layer 274. The semiconductor layer 272 substantially functions as a channel through which an electric current flows. The ohmic contact layer 274 decreases a contact resistance between the semiconductor layer 272 and the source and drain electrodes 244 and 246. For example, the semiconductor layer 272 may include amorphous silicon ("a-Si"), and the ohmic contact layer 274 may include a-Si doped with n-type dopants at a high concentration ("n+ a-Si").

When a mask for patterning the active pattern 270 is different from that for patterning the second metal pattern 240, the active pattern 270 may be formed on a portion of the insulating layer 230, which overlaps with the gate electrode 224. Alternatively, when a mask for patterning the active pattern 270 is substantially the same as that for patterning the second metal pattern 240, the active pattern 270 has substantially the same shape as the second metal pattern 240.

Accordingly, the thin-film transistor TFT having the gate electrode 224, the source electrode 244, the drain electrode 246 and the active pattern 270, is formed in each pixel P of the display substrate 200. At least one thin-film transistor TFT is formed in each pixel P, to drive each pixel P, independently. The thin-film transistor TFT applies the pixel voltage that is applied through the data line 222 in response to the scanning signal applied through the gate line 242, to the pixel electrode 260.

The storage line 248 is electrically separated from the gate line 242 between adjacent gate lines 242. The storage line 248 faces the pixel electrode 260 disposing the protective layer 250 between the storage line 248 and the pixel electrode 260, to form a storage capacitor Cst. The pixel voltage applied to the pixel electrode 260 through the thin-film transistor TFT is maintained for one frame by the storage capacitor Cst.

For example, a constant voltage such as a common voltage Vcom or a gate-off voltage Voff may be applied to the storage line 248. Alternatively, no voltage may be applied to the storage line 248, and thus the storage line 248 may maintain a floating state.

The storage line 248 includes a first portion 248a and a second portion 248b extending from the first portion 248a.

The first portion 248a extends substantially parallel with the gate lines 242 between adjacent gate lines 242. In an exemplary embodiment, the first portion 248a is entirely overlapped by the pixel electrode 260 in each pixel P, to form the storage capacitor Cst. The first portion 248a has a relatively thinner width than the second portion 248b, to enhance an aperture ratio, and is adjacent to the gate line 242 disposed at an upper side of the first portion 248a. In an exemplary embodiment, the first portion 248a is disposed on a side of a pixel P opposite to a location of the thin-film transistor TFT.

The second portion 248b extends along the data line 222 from the first portion 248a, to overlap with the data line 222. The second portion 248b may be a light-blocking layer blocking light generated from a backlight assembly (not shown) of a display device containing the display apparatus 100. A width of the second portion 248b is larger than that of the data line 222, to prevent the light from leaking from both sides of the data line 222. For example, the width of the data line 222 may be between about 3 μm and about 4 μm, and the width of the second portion 248b may be between about 14 μm and about 16 μm.

In addition, the second portion 248b is partially overlapped by the pixel electrode 260, to form the storage capacitor Cst. For example, an overlapping distance between the second portion 248b and the pixel electrode 260 may be in a range of about 2 μm and about 5 μm.

Accordingly, the storage line 248 is formed along a side of each pixel P to form the storage capacitor Cst, so that the aperture ratio is enhanced.

For example, the second metal pattern 240 may include a molybdenum/aluminum/molybdenum (Mo/Al/Mo) triple-layer structure having a molybdenum (Mo) layer, an aluminum (Al) layer and a molybdenum (Mo) layer sequentially stacked. Alternatively, the second metal pattern 240 may include a single metal such as aluminum (Al), molybdenum (Mo), neodymium (Nd), chromium (Cr), tantalum (Ta), titanium (Ti), tungsten (W), copper (Cu), silver (Ag) and so on, or an alloy thereof. In addition, the second metal pattern 240 may include a plurality of layers having the single metal or alloy.

The protective layer 250 is formed on the first substrate 210 on which the second metal pattern 240 is formed, covering the second metal pattern 240 and the exposed portions of the insulating layer 230. The protective layer 250 protects and insulates the second metal pattern 240, and for example, may include silicon nitride (SiNx) or silicon oxide (SiOx). The pixel electrode 260 is formed on the protective layer 250 to correspond to each pixel P. The pixel electrode 260 includes a transparent conductive material, so that the light passes through the pixel electrode 260. For example, the pixel electrode 260 may include indium zinc oxide ("IZO") or indium zinc oxide ("ITO").

The pixel electrode 260 is electrically connected to the drain electrode 246 through a first contact hole CNT1 formed through the protective layer 250. Thus, when the scanning signal is applied to the gate electrode 224 of the thin-film transistor TFT through the gate line 242, the thin-film transistor TFT is turned on, so that the pixel voltage applied to the source electrode 244 of the thin-film transistor TFT through the data line 222 is applied to the pixel electrode 260 via the drain electrode 246. The electrical connection between the gate electrode 224 and the gate line 242, and the electrical connection between the source electrode 244 and the data line 222 will be described further below.

The pixel electrode 260 entirely overlaps with the first portion 248a of the storage line 248, and partially overlaps with the second portion 248b of the storage line 248, to form the storage capacitor Cst. The pixel voltage applied to the pixel electrode 260 by driving the thin-film transistor TFT, is maintained for one frame through the storage capacitor Cst.

Although not shown, the pixel electrode 260 may include a predetermined opening pattern to divide each pixel P into a plurality of domains, so that a light viewing angle may be enhanced.

The display substrate 200 may further include a first connecting electrode 262 to electrically connect the data line 222 to the source electrode 244, and a second connecting electrode 264 to electrically connect the gate line 242 to the gate electrode 224. The first connecting electrode 262 and the second connecting electrode 264 may be formed on the protective layer 250, within a same layer as the pixel electrode 260. The first connecting electrode 262 and the second connecting electrode 264 may be spaced and electrically separated from each other and the pixel electrode 260.

The data line 222 is disposed under the insulating layer 230, and the source electrode 244 is disposed over the insulating layer 230, so that the first connecting electrode 262 electrically connects the data line 222 to the source electrode 244 through a second contact hole CNT2 formed through the insulating layer 230 and the protective layer 250.

The gate line 242 is formed over the insulating layer 230, and the gate electrode 224 is formed under the insulating layer 230, so that the second connecting electrode 264 electrically connects the gate line 222 to the gate electrode 224 through a third contact hole CNT3 formed through the insulating layer 230 and the protective layer 250.

The first connecting electrode 262 and the second connecting electrode 264 include a transparent conductive layer. For example, the first and second electrodes 262 and 264 may include ITO or IZO, and may be formed of the same material as the pixel electrode 260.

Accordingly, the data line 222 is formed from the first metal pattern 220 disposed under the insulating layer 230, and the gate line 242 and the storage line 248 are formed from the second metal pattern 240 disposed over the insulating layer 230, so that the second portion 248b is disposed between the underlying data line 222 and the overlapping pixel electrode 260. The second portion 248b formed between the data line 222 and the pixel electrode 260 entirely removes parasitic capacitance generated between the data line 222 and the pixel electrode 260, to prevent defects such as vertical lines.

In addition, the second portion 248b prevents the parasitic capacitance between the data line 222 and the pixel electrode 260, so that a distance between pixel electrodes 260 adjacent to each other is decreased as much as a maximum resolution capacity of an exposure apparatus. Thus, the width of the second portion 248b is decreased to enhance the aperture ratio much more. For example, the distance between the pixel electrodes 260 adjacent to each other may be between about 4 μm and about 5 μm, and the width of the second portion 248b may be between about 14 μm and about 16 μm to be partially overlapped by the pixel electrode 260. The second portion 248b may also be partially overlapped by an adjacent pixel electrode (not shown) in an adjacent pixel P in a row direction.

Also, when the second portion 248b is formed from the second metal pattern 240 having the Mo/Al/Mo triple-layer structure, a lower layer includes molybdenum (Mo) having lower reflectivity than aluminum (Al). In this case, the width and the reflectivity of the second metal pattern 240 having the Mo/Al/Mo triple-layer structure are decreased more than when the second portion 248b is formed from the first metal pattern 220 having aluminum (Al) as the lower layer, so that the defects such as curtain moiré generated by a reflection of the second portion 248b may be prevented.

Furthermore, when an organic layer or a color filter layer having a relatively thick thickness is disposed between the storage line 248 and the pixel electrode 260, a greenish phenomenon displaying green light due to a low storage capacitor Cst and a coupling between the pixel electrodes 260 adjacent to each other may be caused. However, in the present example embodiment, the organic layer or the color filter layer is absent, so that the storage capacitor Cst is relatively large and the coupling between the pixel electrodes 260 adjacent to each other is low. Thus, the greenish phenomenon is prevented.

The opposite substrate 300 faces the display substrate 200 to interpose the liquid crystal layer 400 between the opposite substrate 300 and the display substrate 200. The opposite substrate 300 may include a common electrode 320 formed on a surface of a second substrate 310 facing the display substrate 200. The common electrode 320 includes a transparent conductive material, so that the light passes through. For example, the common electrode 320 may include IZO or ITO, which is the same as that of the pixel electrode 260. An opening pattern may be formed through the common electrode 320, to enhance the light viewing angle.

The opposite substrate 300 may further include a black matrix 330. The black matrix 330 may be formed between the second substrate 310 and the common electrode 320. The black matrix 330 is formed at sides of the pixels P, to prevent the light from leaking and to enhance a contrast ratio. A portion of the black matrix 330 partially overlaps with the data line 222 of the display substrate 200 when the display apparatus 100 is assembled as shown in FIG. 2. In this case, a width of the portion of the black matrix 330 disposed over the data line 222 may be smaller than that of the second portion 248b of the storage line 248. For example, the width of the portion of the black matrix 330 disposed over the data line 222 may be smaller than that of the second portion 248b by between about 4 μm and about 5 μm.

Liquid crystal molecules having optical and electrical characteristics, such as an anisotropic refractive index, an anisotropic dielectric constant and so on, are arranged in the liquid crystal layer 400. An arrangement direction of the liquid crystal molecules is changed by an electric field generated between the pixel electrodes 260 and the common electrode 320, so that a transmissivity of the light passing through the liquid crystal layer 400 is controlled.

Figure 3:
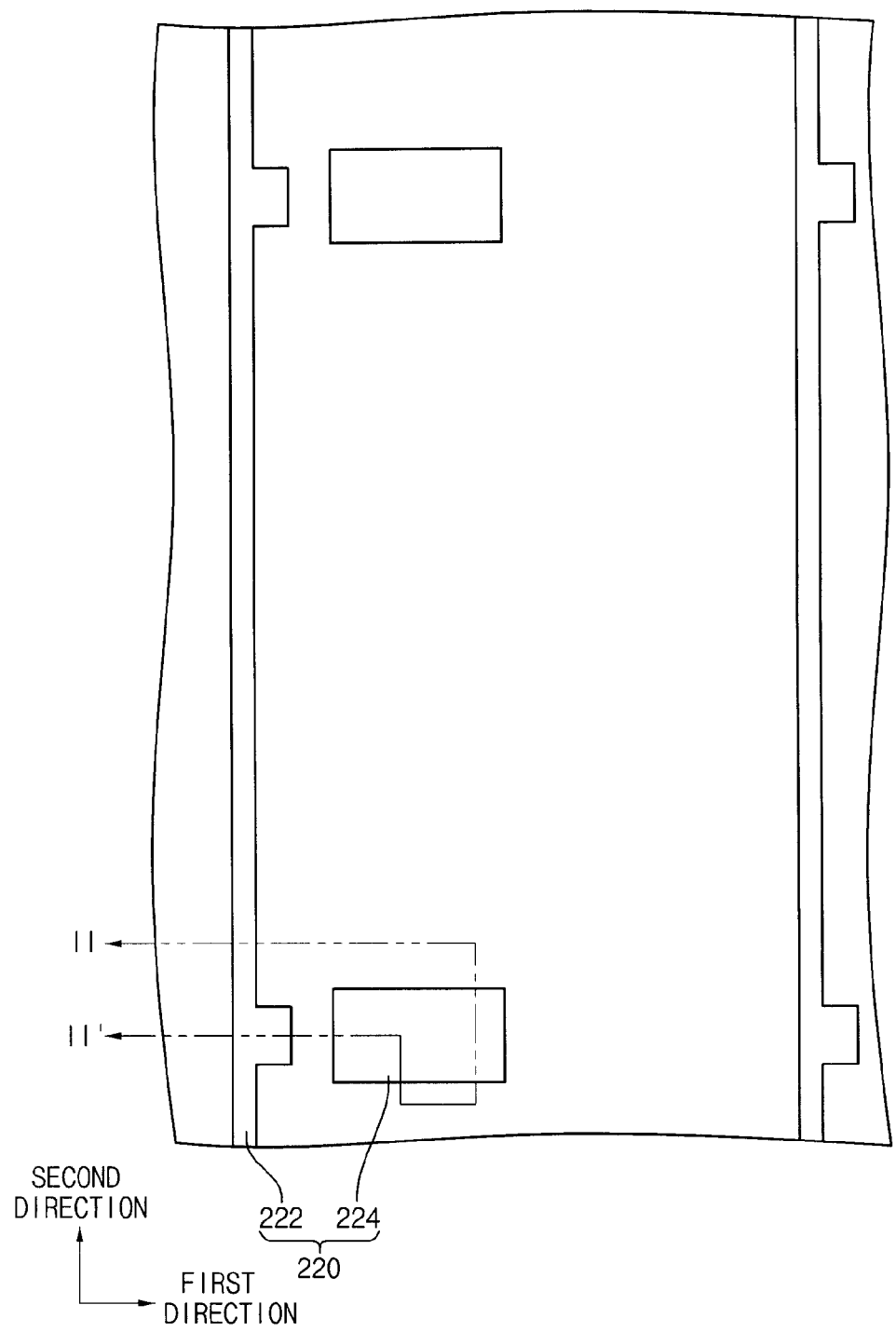
FIG. 3 is a plan view illustrating an exemplary process for manufacturing the exemplary first display substrate in FIGS. 1 and 2.
Figure 4:
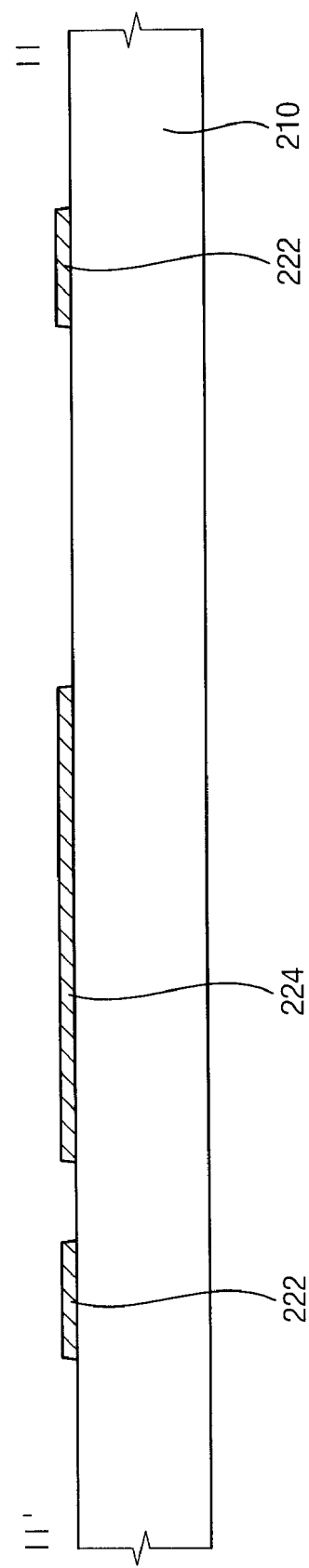
FIG. 4 is a cross-sectional view taken along line II-II' of FIG. 3.

FIG. 3 is a plan view illustrating an exemplary process for manufacturing an exemplary first display substrate in FIGS. 1 and 2. FIG. 4 is a cross-sectional view taken along line II-II' of FIG. 3.

Referring to FIGS. 3 and 4, the first metal pattern 220 having the data line 222 to which the pixel voltage is applied and the gate electrode 224, is formed on the first substrate 210.

In an exemplary embodiment, the data line 222 may extend along a second direction. The data line 222 may include a protrusion projecting towards a location of the thin-film transistor TFT. The gate electrode 224 is separated from the data line 222, may be formed to have an island shape, and forms the gate terminal of the thin-film transistor TFT.

In an exemplary embodiment, the first metal pattern 220 may include the Mo/Al double-layer structure having aluminum (Al) and molybdenum (Mo) sequentially integrated. Alternatively, the first metal pattern 220 may include the single metal such as aluminum (Al), molybdenum (Mo), neodymium (Nd), chromium (Cr), tantalum (Ta), titanium (Ti), tungsten (W), copper (Cu), silver (Ag) and so on, or the alloy thereof. In addition, the first metal pattern 220 may include the plurality of layers having the single metal or alloy.

Figure 5:
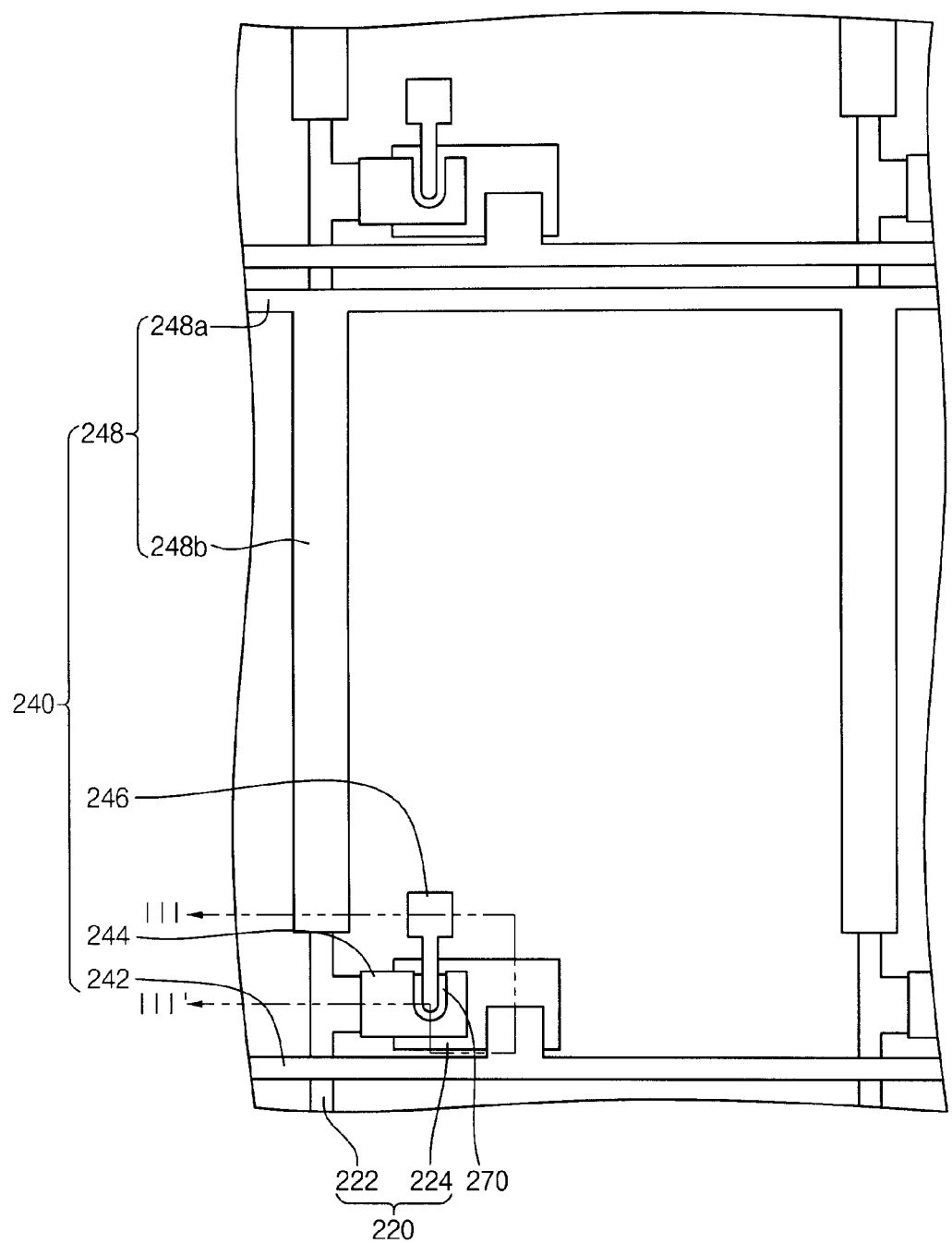
FIG. 5 is a plan view illustrating a subsequent exemplary process for manufacturing the exemplary first display substrate in accordance with an exemplary embodiment of the present invention.
Figure 6:
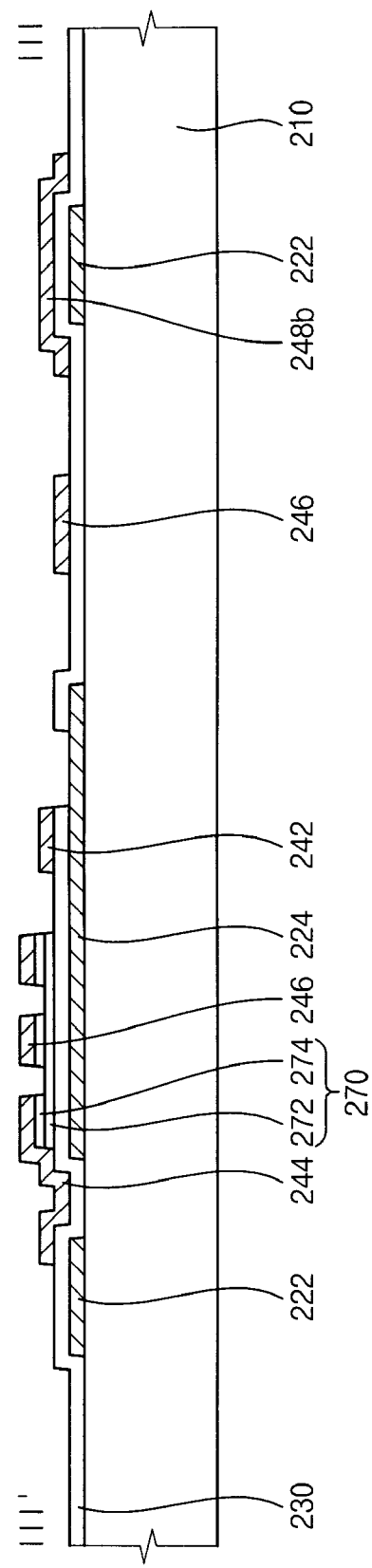
FIG. 6 is a cross-sectional view taken along line III-III' of FIG. 5.

FIG. 5 is a plan view illustrating an exemplary process for manufacturing an exemplary first display substrate in accordance with an exemplary embodiment of the present invention. FIG. 6 is a cross-sectional view taken along line II-II' of FIG. 5.

Referring to FIGS. 5 and 6, the insulating layer 230 is formed on the first substrate 210 on which the first metal pattern 220 is formed. For example, the insulating layer 230 may include silicon nitride (SiNx) or silicon oxide (SiOx), and the thickness of the insulating layer 230 may be between about 4,000 Å and about 4,500 Å.

Then, the active pattern 270 and the second metal pattern 240 are formed on the insulating layer 230. The active pattern 270 and the second metal pattern 240 may be respectively patterned via two different masks. In an exemplary embodiment, when the active pattern 270 and the second metal pattern 240 are respectively patterned via two different masks, the active pattern 270 may be selectively formed on a portion overlapping with the gate electrode 224. Alternatively, the active pattern 270 and the second metal pattern 240 may be patterned via one mask. For example, when the active pattern 270 and the second metal pattern 240 are patterned via one mask, the active pattern 270 may be formed to have substantially the same shape as the second metal pattern 240.

The active pattern 270 is formed between the insulating layer 230 and the source and drain electrodes 244 and 246, so that the active pattern 270 overlaps with the gate electrode 224. The active pattern 270 may include the semiconductor layer 272 and the ohmic contact layer 274. For example, the semiconductor layer 272 may include amorphous silicon ("a-Si"), and the ohmic contact layer 274 may include a-Si doped with n-type dopants at a high concentration ("n+ a-Si").

The second metal pattern 240 includes a gate line 242 to which the scanning signal is applied, the source electrode 244, the drain electrode 246 and the storage line 248. The gate line 242, the source electrode 244, the drain electrode 246 and the storage line 248 are separated from each other.

In an exemplary embodiment, the gate line 242 may extend along the first direction to cross the data line 222. The gate line 242 may include a protrusion projecting towards a location of the thin-film transistor TFT. The protrusion of the gate line 242 may partially overlap with the gate electrode 224. The source electrode 244 is electrically separated from the gate line 242, and at least partially overlaps with the gate electrode 224, so that the source electrode 244 forms the source terminal of the thin-film transistor TFT. In an exemplary embodiment, the source electrode 244 may partially overlap with the protrusion projecting from the data line 222. The drain electrode 246 is spaced apart from the source electrode 244 by a predetermined distance, and at least partially overlaps with the gate electrode 244, so that the drain electrode 246 forms the drain terminal of the thin-film transistor TFT.

The storage line 248 includes the first portion 248a extending substantially parallel with the gate line 242, and the second portion 248b extending from the first portion 248a along the data line 222 to overlap with the data line 222. The first portion 248a has a relatively thinner thickness than the second portion 248b to enhance the aperture ratio, and is adjacent to the gate line 242 of a previous pixel P in a column direction disposed at the upper side of the first portion 248a. The width of the first portion 248b is larger than that of the data line 222, to prevent the light from leaking at both sides of the data line 222. For example, the width of the light-blocking portion 248b may be between about 14 μm and about 16 μm. Accordingly, the storage line 248 is formed along the sides of each pixel P to form the storage capacitor Cst, so that the light may be prevented from leaking at the sides of the pixel P and the aperture ratio may be enhanced.

In an exemplary embodiment, the second metal pattern 240 may include the Mo/Al/Mo triple-layer structure having a molybdenum (Mo) layer, an aluminum (Al) layer and a molybdenum (Mo) layer sequentially stacked. Alternatively, the second metal pattern 240 may include the single metal such as aluminum (Al), molybdenum (Mo), neodymium (Nd), chromium (Cr), tantalum (Ta), titanium (Ti), tungsten (W), copper (Cu), silver (Ag) and so on, or the alloy thereof. In addition, the second metal pattern 240 may include the plurality of layers having the single metal or alloy.

The ohmic contact layer 274 in a channel area between the source and drain electrodes 244 and 246 is removed to form the thin-film transistor TFT and exposing the semiconductor layer 272 between the source and drain electrodes 244 and 246.

Figure 7:
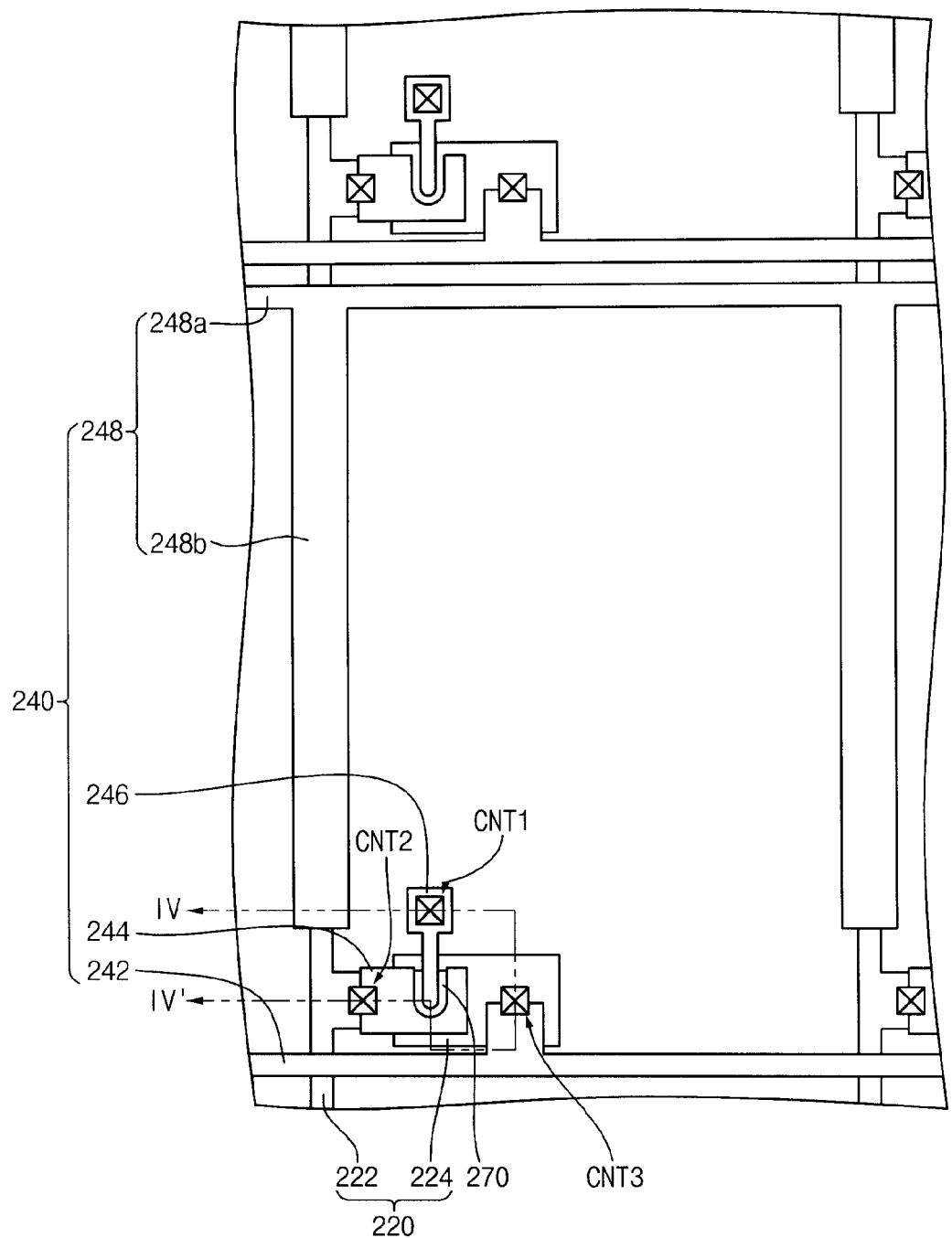
FIG. 7 is a plan view illustrating a subsequent exemplary process for manufacturing the exemplary first display substrate in accordance with an exemplary embodiment of the present invention.
Figure 8:
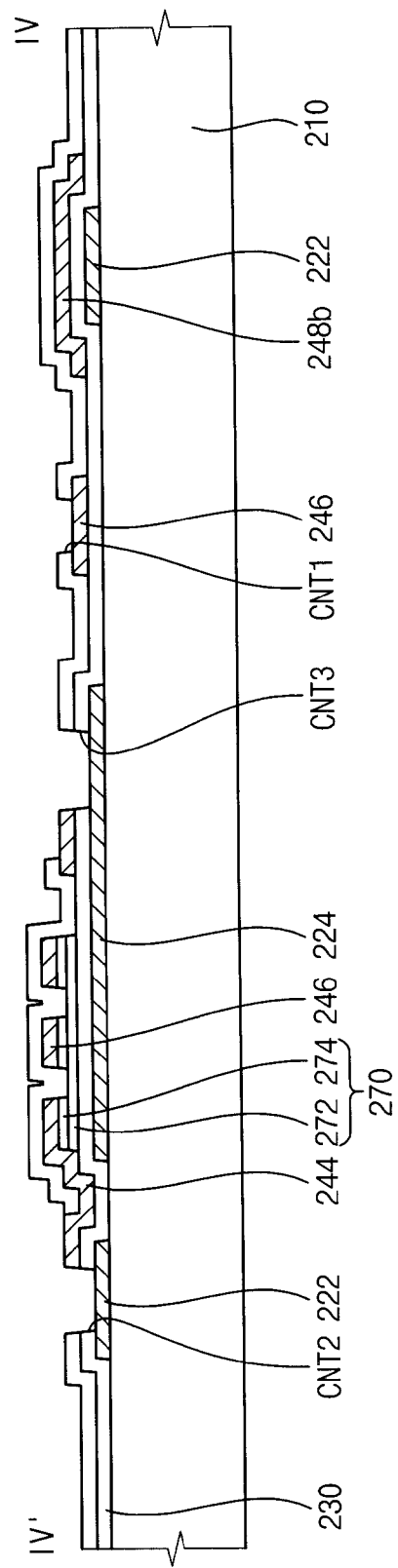
FIGS. 8 and 9 are cross-sectional views taken along line IV-IV' of FIG. 7.
Figure 9:
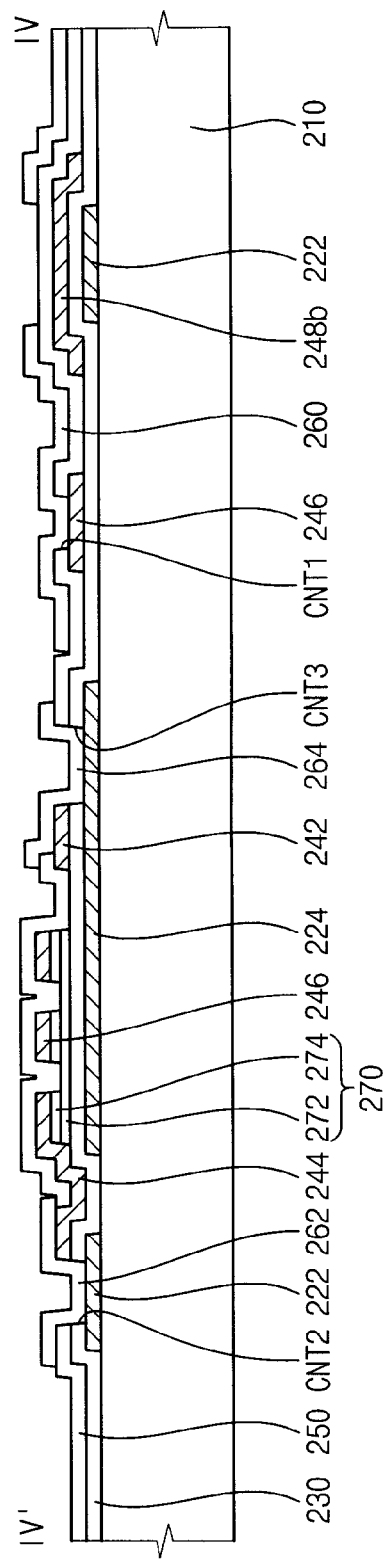

FIG. 7 is a plan view illustrating an exemplary process for manufacturing an exemplary first display substrate in accordance with an exemplary embodiment of the present invention. FIGS. 8 and 9 are cross-sectional views taken along line IV-IV' of FIG. 7.

Referring to FIGS. 7 and 8, the protective layer 250 is formed on the first substrate 210 on which the second metal pattern 240 is formed, so as to overlap the insulating layer 230, the second metal pattern 240, and exposed portions of the semiconductor layer 272. For example, the protective layer 250 may include silicon nitride (SiNx) or silicon oxide (SiOx), and the thickness of the protective layer 250 may be between about 1,500 Å and about 2,000 Å.

Then, the protective layer 250 and the insulating layer 230 are patterned via a photolithography process, so that the first, second and third contact holes CNT1, CNT2 and CNT3 are formed. The first contact hole CNT1 partially exposes the drain electrode 246, the second contact hole CNT2 exposes an area of the data line 222 and an area of the source electrode 244, such as an area where the source electrode 244 partially overlaps the data line 222, to provide an area where the source electrode 244 and the data line 222 will join each other, and the third contact hole CNT3 exposes an area of the gate line 242 and an area of the gate electrode 224, such as an area where the gate line 242 partially overlaps the gate electrode 224, to provide an area where the gate line 242 and the gate electrode 224 will join each other.

Then, referring to FIGS. 1 and 9, the pixel electrode 260, the first connecting electrode 262 and the second connecting electrode 264 are formed on the protective layer 250 through which the first, second and third contact holes CNT1, CNT2 and CNT3 are formed. The pixel electrode 260, the first connecting electrode 262 and the second connecting electrode 264 are electrically separated from each other.

The pixel electrode 260 is electrically connected to the drain electrode 246 through the first contact hole CNT1 formed through the protective layer 250. The pixel electrode 260 entirely overlaps with the first portion 248a of the storage line 248, and partially overlaps with the second portion 248b of the storage line 248, to form the storage capacitor Cst. The first connecting electrode 262 electrically connects the data line 222 to the source electrode 244 thought the second contact hole CNT2 formed through the insulating layer 230 and the protective layer 250. The second connecting electrode 264 electrically connects the gate line 242 to the gate electrode 224 through the third contact hole CNT3 formed through the insulating layer 230 and the protective layer 250.

In an exemplary embodiment, the pixel electrode 260, the first connecting electrode 262 and the second connecting electrode 264 may include IZO or ITO. Alternatively, the first and second connecting electrodes 262 and 264 may include a conductive material different from the pixel electrode 260.

According to the present invention, a storage line is formed between a data line and a pixel electrode, so that parasitic capacitance generated between the data line and the pixel electrode may be entirely removed. Thus, defects such as vertical lines may be prevented.

In addition, the parasitic capacitance between the data line and the pixel electrode may be blocked by the storage line, so that the distance between the pixel electrodes adjacent to each other may be decreased and the width of the storage line may be decreased. Thus, an aperture ratio may be enhanced.

Furthermore, the width of the storage line may be decreased and a lower layer of the storage line may include molybdenum (Mo) having lower reflectivity than aluminum (Al), so that defects such as a curtain moiré phenomenon may be prevented.

Having described exemplary embodiments of the present invention and their advantages, it is noted that various changes, substitutions and alterations can be made herein without departing from the spirit and scope of the invention as defined by the appended claims.

What is claimed is:

1. A display substrate comprising:
   a first metal pattern formed on a substrate and including a data line to which a pixel voltage is applied and a gate electrode;
   an insulating layer formed on the substrate on which the first metal pattern is formed;
   an active pattern formed on the insulating layer;
   a second metal pattern formed on the insulating layer and including a gate line and a storage line, the gate line crossing the data line, a scanning signal applied to the gate line;
   a protective layer formed on the substrate on which the second metal pattern is formed; and
   a pixel electrode formed on the protective layer.

2. The display substrate of claim 1, wherein the gate electrode is separated from the data line.

3. The display substrate of claim 2, wherein the second metal pattern further comprises:
   a source electrode at least partially overlapping with the gate electrode; and
   a drain electrode at least partially overlapping with the gate electrode and electrically connected to the pixel electrode.

4. The display substrate of claim 3, wherein the active pattern is at least partially formed between the insulating layer and the source and drain electrodes.

5. The display substrate of claim 3, further comprising:
   a first connecting electrode electrically connecting the data line to the source electrode; and
   a second connecting electrode electrically connecting the gate line to the gate electrode.

6. The display substrate of claim 5, wherein the first and second connecting electrodes include a transparent conductive layer.

7. The display substrate of claim 1, wherein the storage line comprises:
   a first portion extending substantially parallel to the gate line; and
   a second portion extending from the first portion to overlap with the data line.

8. The display substrate of claim 7, wherein a width of the second portion is larger than a width of the data line disposed under the second portion.

9. The display substrate of claim 7, wherein the first and second portions partially overlap with the pixel electrode.

10. The display substrate of claim 9, wherein an overlapping distance between the second portion and the pixel electrode is between about 2 μm and about 5 μm.

11. The display substrate of claim 7, wherein the storage line is electrically separated from the gate line.

12. A display apparatus comprising:
    a display substrate including:
      a first metal pattern formed on a first substrate and including a data line to which a pixel voltage is applied and a gale electrode;
      an insulating layer formed on the first substrate on which the first metal pattern is formed;
      an active pattern formed on the insulating layer;
      a second metal pattern formed on the insulating layer and including a gate line and a storage line, the gate line crossing the data line, and a scanning signal applied to the gate line;

a protective layer formed on the first substrate on which the second metal pattern is formed; and a pixel electrode formed on the protective layer;

an opposite substrate facing the display substrate; and a liquid crystal layer disposed between the display substrate and the opposite substrate.

13. The display apparatus of claim 12, wherein the gate electrode is separated from the data line, and the second metal pattern further comprises a source electrode at least partially overlapping with the gate electrode, and a drain electrode at least partially overlapping with the gate electrode and electrically connected to the pixel electrode.

14. The display apparatus of claim 13, wherein the display substrate further comprises:

a first connecting electrode electrically connecting the data line to the source electrode; and a second connecting electrode electrically connecting the gate line to the gate electrode.

15. The display apparatus of claim 12, wherein the storage line comprises:

a first portion extending substantially parallel to the gate line; and a second portion extending from the first portion to overlap with the data line.

16. The display apparatus of claim 15, wherein a width of the second portion is larger than a width of the data line disposed under the second portion.

17. The display apparatus of claim 15, wherein the first and second portions partially overlap with the pixel electrode.

18. The display apparatus of claim 17, wherein an overlapping distance between the second portion and the pixel electrode is between about 2 μm and about 5 μm.

19. The display apparatus of claim 15, wherein the opposite substrate comprises:

a black matrix formed at a side of each pixel; and a common electrode formed on a surface of the opposite substrate facing the display substrate.

20. The display apparatus of claim 19, wherein a width of the black matrix disposed over the data line is smaller than a width of the second portion of the storage line.

21. The display apparatus of claim 20, wherein a difference between the width of the black matrix disposed over the data line and the width of the second portion of the storage line is between about 4 μm and about 5 μm.

* * * * *